United States Patent
Lakshmanan et al.

(10) Patent No.: US 7,302,654 B2
(45) Date of Patent: Nov. 27, 2007

(54) METHOD OF AUTOMATING PLACE AND ROUTE CORRECTIONS FOR AN INTEGRATED CIRCUIT DESIGN FROM PHYSICAL DESIGN VALIDATION

(75) Inventors: Viswanathan Lakshmanan, Thornton, CO (US); Michael Josephides, Broomfield, CO (US); Richard D. Blinne, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 279 days.

(21) Appl. No.: 10/977,386

(22) Filed: Oct. 29, 2004

(65) Prior Publication Data
US 2006/0095883 A1  May 4, 2006

Related U.S. Application Data

(63) Continuation-in-part of application No. 10/975,570, filed on Oct. 27, 2004, now abandoned.

(51) Int. Cl.
*G06F 17/50* (2006.01)
(52) U.S. Cl. ............................................. 716/5; 716/4
(58) Field of Classification Search .............. 716/4–5
See application file for complete search history.

(56) References Cited

U.S. PATENT DOCUMENTS

| | | | | |
|---|---|---|---|---|
| 6,009,251 A | * | 12/1999 | Ho et al. | 716/5 |
| 6,026,224 A | * | 2/2000 | Darden et al. | 716/10 |
| 7,076,410 B1 | * | 7/2006 | Kerzman et al. | 703/6 |
| 7,107,559 B2 | * | 9/2006 | Lakshmanan et al. | 716/7 |
| 7,117,464 B2 | * | 10/2006 | Frank et al. | 716/5 |
| 2006/0090144 A1 | * | 4/2006 | Lakshmanan et al. | 716/2 |

* cited by examiner

*Primary Examiner*—Vuthe Siek
(74) *Attorney, Agent, or Firm*—Eric James Whitesell

(57) ABSTRACT

A method and computer program product for automatically correcting errors in an integrated circuit design includes steps of: (a) performing a physical design validation of an integrated circuit design to verify compliance with a set of design rules; (b) generating a results database of design rule violations detected by the physical design validation; (c) identifying locations in the integrated circuit design from the results database for making design corrections according to a post-processing rule deck so that the locations of the design corrections comply with the set of design rules; and (d) implementing the design corrections in the integrated circuit design.

8 Claims, 4 Drawing Sheets

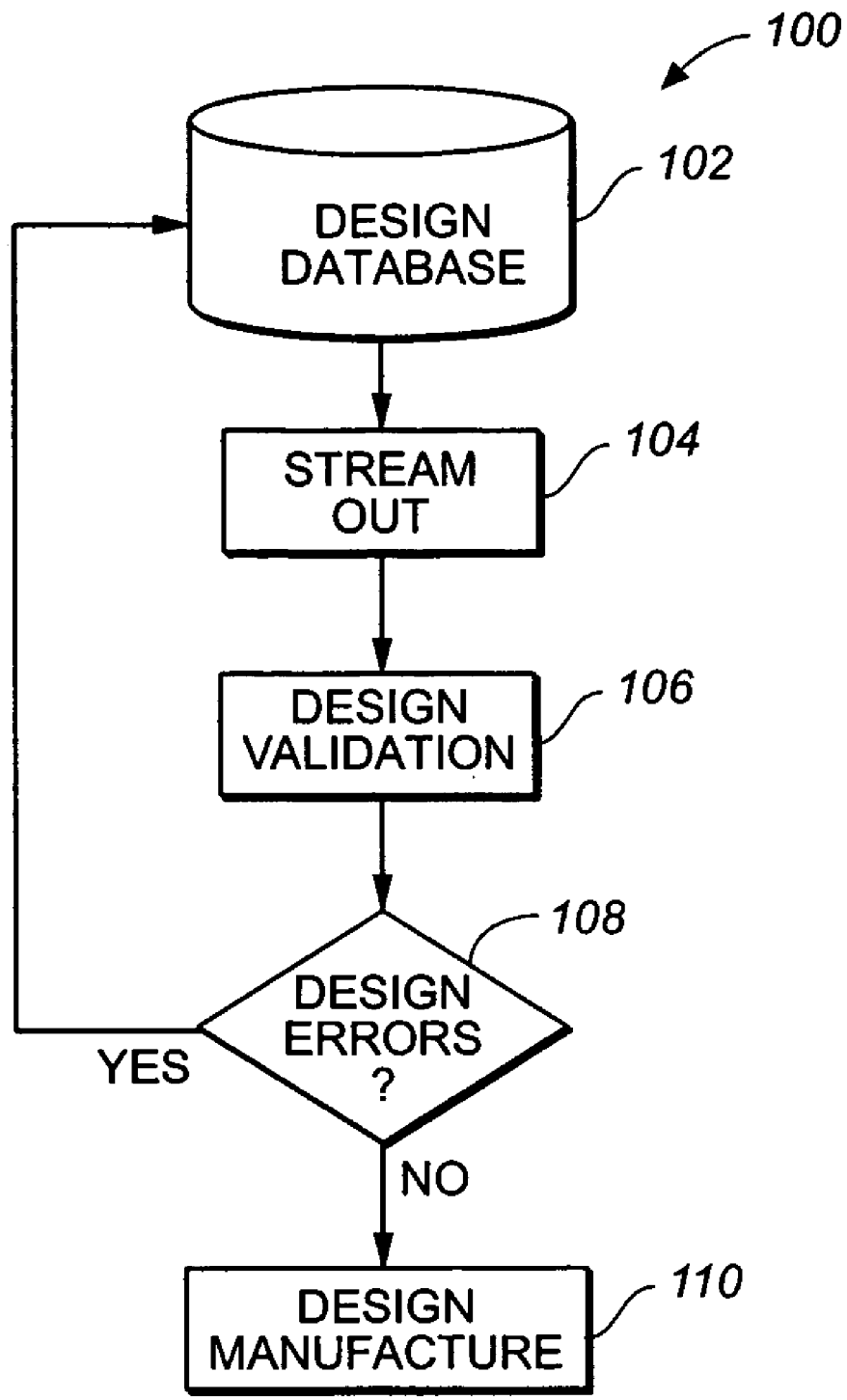
FIG._1
(PRIOR ART)

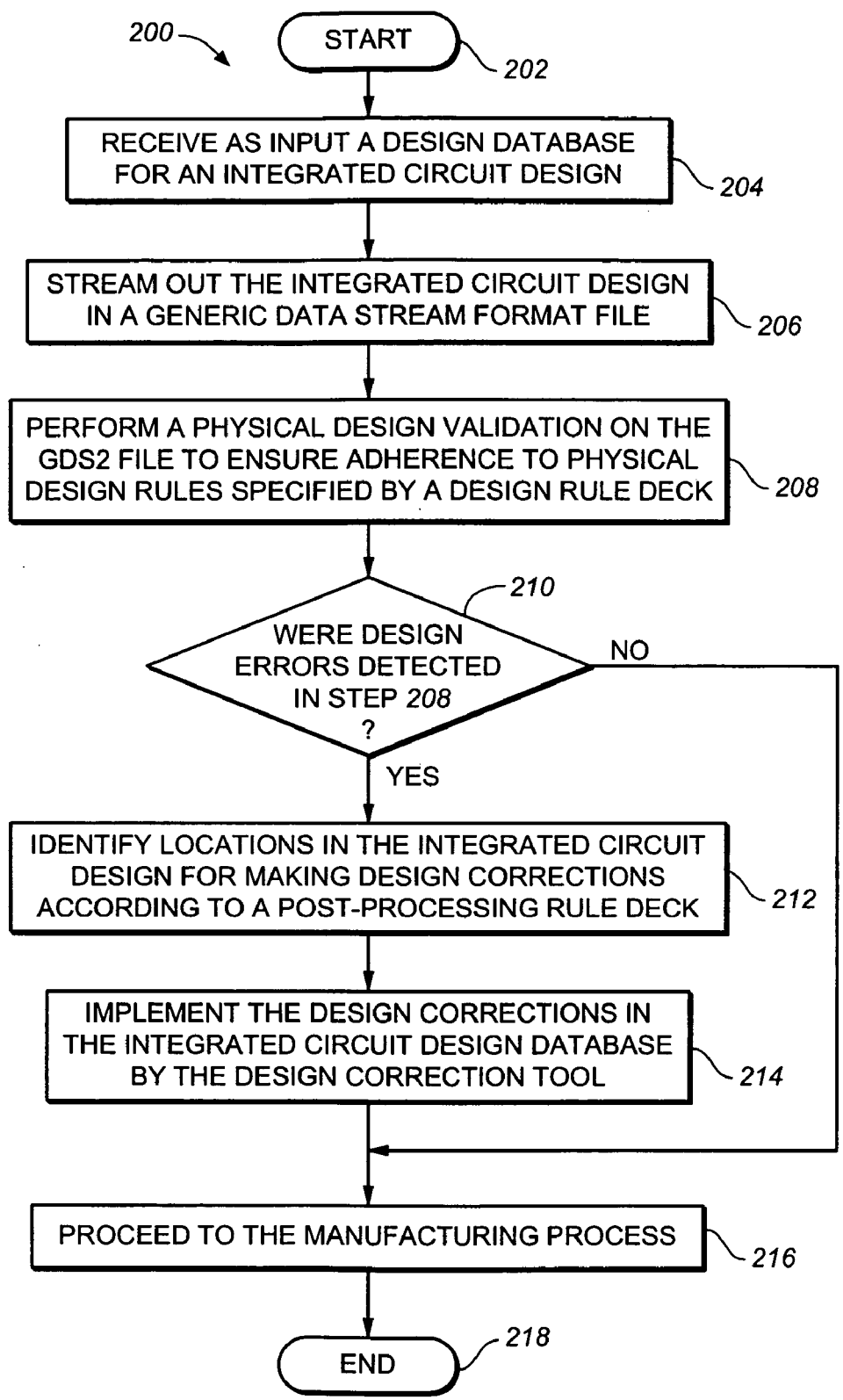
FIG._2

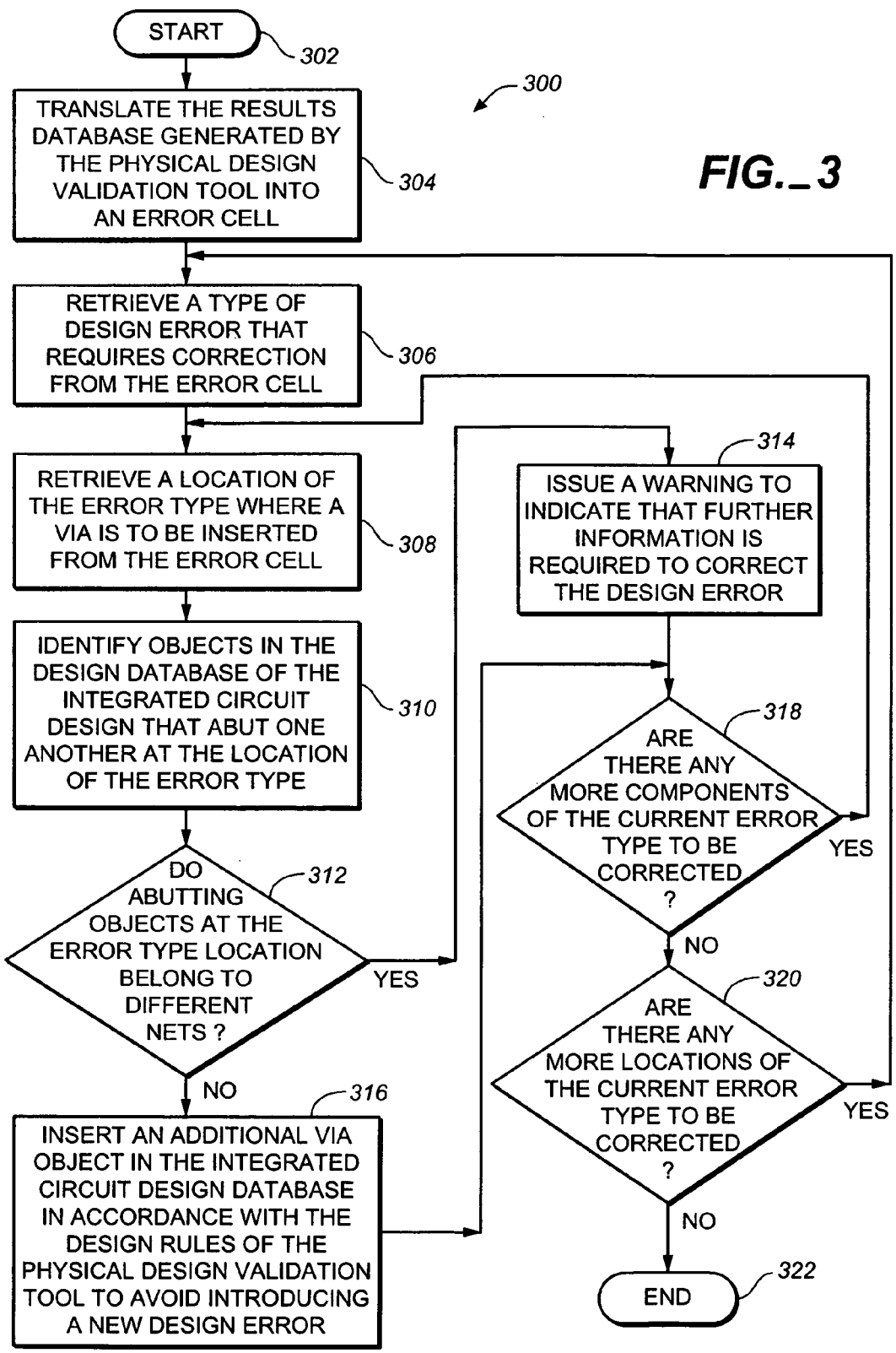
FIG._3

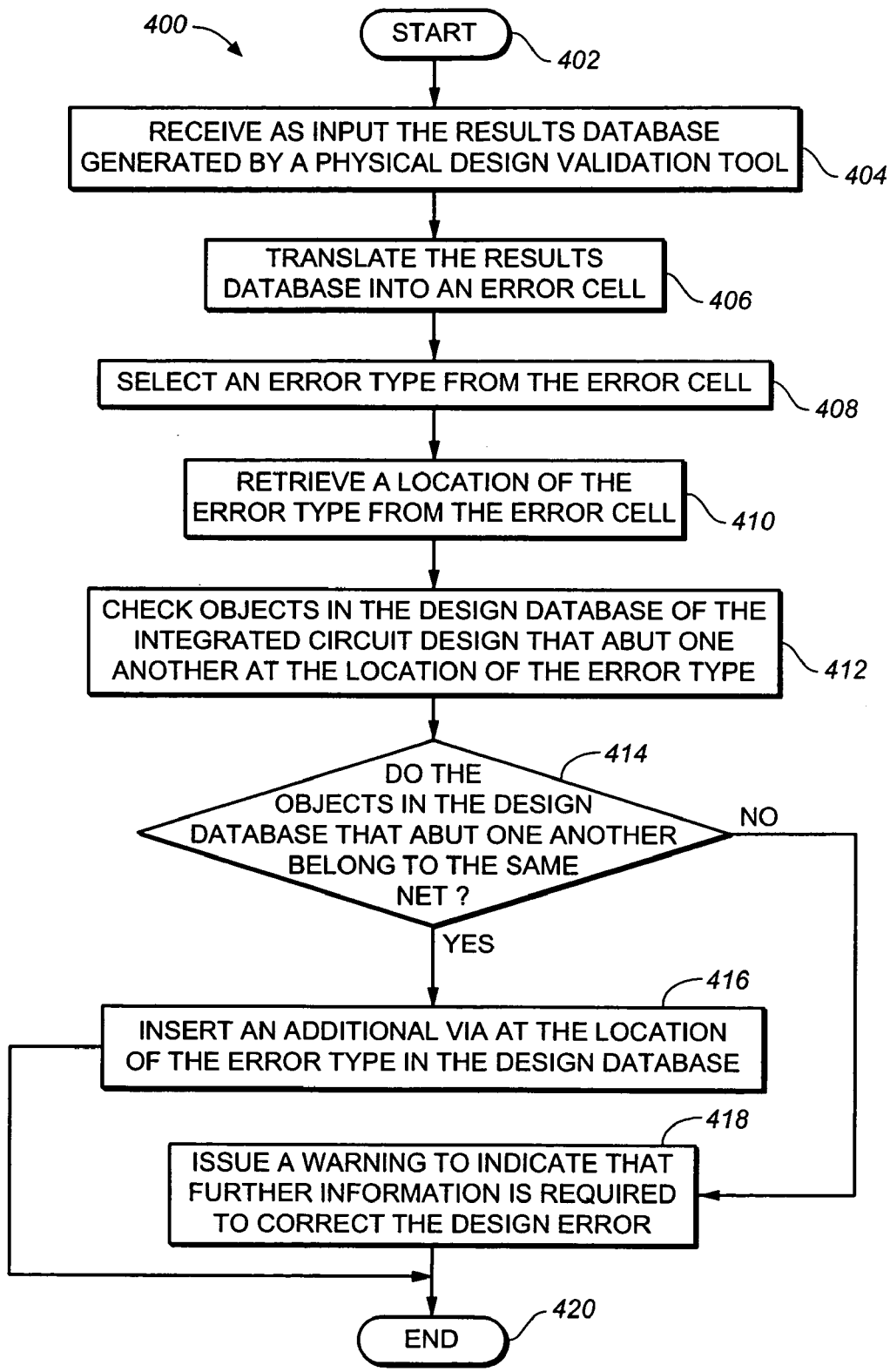
FIG._ 4

METHOD OF AUTOMATING PLACE AND ROUTE CORRECTIONS FOR AN INTEGRATED CIRCUIT DESIGN FROM PHYSICAL DESIGN VALIDATION

CROSS REFERENCE TO RELATED APPLICATIONS

This application for patent is a continuation-in-part of abandoned U.S. patent application Ser. No. 10/975,570, filed Oct. 27, 2004, for METHOD OF AUTOMATING PLACE AND ROUTE CORRECTIONS FOR AN INTEGRATED CIRCUIT DESIGN FROM PHYSICAL DESIGN VALIDATION, incorporated herein by reference.

REFERENCE TO COMPUTER PROGRAM LISTING APPENDIX

The following computer program listing files are submitted on a compact disc and are incorporated herein by reference:

| NAME | CREATION DATE | SIZE (bytes) |
| --- | --- | --- |
| header.txt | Sep. 22, 2004 | 831 |
| rules.txt | Sep. 01, 2004 | 527,006 |

BACKGROUND OF THE INVENTION

1. Field of the Invention

The present invention relates generally to the design of integrated circuits. More specifically, but without limitation thereto, the present invention relates to methods of verifying an integrated circuit design to ensure adherence to process rules and overall manufacturability of the integrated circuit design for a specific technology.

2. Description of Related Art

Physical design validation of an integrated circuit design is an important aspect of the overall design flow. The physical design validation step ensures that the design of the integrated circuit die complies to all process rules and that any additional required steps specific to manufacturability for a selected technology have been performed. The same software tools for performing the physical design validation are used by many integrated circuit manufacturers and are a standard in the industry.

SUMMARY OF THE INVENTION

In one embodiment, a method includes steps of:
(a) performing a physical design validation of an integrated circuit design to verify compliance with a set of design rules;
(b) generating a results database of design rule violations detected by the physical design validation;
(c) identifying locations in the integrated circuit design from the results database for making design corrections according to a post-processing rule deck so that the locations of the design corrections comply with the set of design rules; and
(d) implementing the design corrections in the integrated circuit design.

In another embodiment, a computer program product for intelligent physical design validation and incorporation of design objects based on design rule violations includes:

a medium for embodying a computer program for input to a computer; and
a computer program embodied in the medium for causing the computer to perform steps of:
(a) performing a physical design validation of an integrated circuit design to verify compliance with a set of design rules;
(b) generating a results database of design rule violations detected by the physical design validation;
(c) identifying locations in the integrated circuit design from the results database for making design corrections according to a post-processing rule deck so that the locations of the design corrections comply with the set of design rules; and
(d) implementing the design corrections in the integrated circuit design.

BRIEF DESCRIPTION OF THE DRAWINGS

The embodiments described herein are illustrated by way of example and not limitation in the accompanying figures, in which like references indicate similar elements throughout the several views of the drawings, and in which:

FIG. 1 illustrates block diagram for a design flow of a physical design validation according to the prior art;

FIG. 2 illustrates a flow chart of a method of automating design corrections for an integrated circuit;

FIG. 3 illustrates an example of an automated design correction tool for the method of FIG. 2; and FIG. 4 illustrates a flow chart of a computer program product for automatically correcting a single design error in an integrated circuit.

Elements in the figures are illustrated for simplicity and clarity and have not necessarily been drawn to scale. For example, the dimensions of some elements in the figures may be exaggerated relative to other elements to point out distinctive features in the illustrated embodiments.

DESCRIPTION OF THE ILLUSTRATED EMBODIMENTS

The physical design validation of an integrated circuit design typically includes a design rule check (DRC) to ensure that all spatial constraints are satisfied for the traces and devices formed in various layers of an integrated circuit die. The structures formed in the several layers of an integrated circuit die are typically represented in a GDS2 (Generic Data Stream) format file that contains the chip topological information for creating the masks used in manufacturing the integrated circuit dies. The GDS2 format is an industry standard used by commercially available physical design validation tools to represent physical design data.

A problem in a typical integrated circuit design flow is that a third party vendor that provides a design rule check tool, for example, in a place and route environment, frequently is not the same vendor that provides the design rule check performed by the sign-off physical design validation tool. An example of different third party vendors of integrated circuit design software used in a design flow is the Synopsys™ tool suite, which has a place and route environment that includes a design rule check, and Calibre™, a physical design validation tool suite from Mentor Graphics that is used for sign-off prior to actual tape-out of the integrated circuit design.

Because most manufacturers of application specific integrated circuits (ASICs) use the physical design validation tool suite Calibre™ from Mentor Graphics, it is desirable to leverage the results to drive the place and route tool to correct design rule violations automatically. However, there are incompatibilities between the design rules used in previous place and route environments and the design rules used by the physical design validation tool. For example, previous place and route environments do not have rule-based design rule check engines. Instead, an extremely limited subset of design rules is applied during placement and routing. Also, previous place and route environments have limited capabilities for rule checking, so that certain aspects of the integrated circuit design may require post-processing. Further, previous place and route environments cannot keep pace with the dynamic nature of process design rule specifications. Even if a rule-based design rule check engine were included in the place and route environment, the turnaround time could be significantly affected.

FIG. 1 illustrates block diagram 100 for a design flow of a physical design validation according to the prior art.

In step 102, a design database for an integrated circuit design is received as input. The design database includes the register transfer level (RTL) code for the design, the netlist, and technology information files that define the devices used to implement the design, the physical dimensions of the devices, and the physical dimensions of the interconnections between the devices.

In step 104, the integrated circuit design is streamed out in a GDS2 (Generic Data Stream) format file that defines the structures formed in the several layers of the integrated circuit die.

In step 106, a physical design validation is performed to ensure adherence to physical design rules, typically using the physical design validation tool suite Calibre™.

In step 108, if design errors are detected in step 106, then the design errors are corrected in a place and route environment, and the design flow iterates from step 102 until no design errors are detected.

In step 110, the design proceeds to the manufacturing process.

A disadvantage of the design flow of FIG. 1 is that the iteration between the place and route environment in step 102 and the physical design validation environment in step 108 results in costly run time and human error in manually correcting the design errors. In the following method, the design flow incorporates the results of the physical design validation directly into the place and route environment without the need for manual intervention.

Given the complexity of current integrated circuit designs and the associated process design rules coupled with aggressive time-to-market schedules, it is desirable to have a single pass design validation solution that avoids the multiple iterations between placement and routing and final physical design validation in the method of FIG. 1. In addition, it is also desirable to automate the design corrections to avoid the limitations and inefficiencies of manual design correction techniques.

In one embodiment, a method of automatically correcting errors in an integrated circuit design includes steps of:

(a) performing a physical design validation of an integrated circuit design to verify compliance with a set of design rules;

(b) generating a results database of design rule violations detected by the physical design validation;

(c) identifying locations in the integrated circuit design from the results database for making design corrections according to a post-processing rule deck so that the locations of the design corrections comply with the set of design rules; and (d) implementing the design corrections in the integrated circuit design.

FIG. 2 illustrates a flow chart 200 of a method of automating design corrections for an integrated circuit.

Step 202 is the entry point of the flow chart 200.

In step 204, a design database for an integrated circuit is received as input. The design database includes, for example, the register transfer level (RTL) code for the design, the netlist, and technology information files that define the devices used to implement the design, the physical dimensions of the devices, and the physical dimensions of the interconnections between the devices.

In step 206, the integrated circuit design is streamed out according to well known techniques in a GDS2 (Generic Data Stream) format file that defines the structures formed in the several layers of the integrated circuit die.

In step 208, a physical design validation is performed on the GDS2 file to ensure adherence to physical design rules specified by a design rule deck, typically using the physical design validation tool suite Calibre™. The design rule deck contains a description of each layer in the integrated circuit design that requires validation of the various aspects of design manufacturability and process requirements. The design rules also check for adherence to electrical connectivity and metal geometries to meet the design performance specifications. In this example, a rule deck for inserting dual vias is described. The physical design validation tool generates a results database that itemizes each of the design rule violations detected in the integrated circuit design.

In step 210, if design errors are detected in step 208, then the post-processing steps 212 and 214 are performed. Otherwise, the design flow continues from step 216.

In step 212, the results database is used to identify locations in the integrated circuit design for making design corrections according to a post-processing rule deck. The post-processing rule deck is designed so that the locations of the design corrections comply with the set of design rules. For example, if the post-processing rule deck determines that an additional via is required in a certain net interconnect of the integrated circuit design, then the post-processing rule deck checks the locations adjacent to existing vias along the net interconnect in which an additional via will not result in a design rule violation according to the set of design rules used by the physical validation tool. Once the allowable locations have been identified for correcting each of the design rule violations listed in the results database, the die coordinates of the locations are recorded in a design correction file for implementation by an automated design correction tool, or optionally by a manual design correction tool if desired.

An example of a post-processing rule deck for making design corrections that comply with the design rules of the Calibre™ physical design validation tool is attached to this application in Standard Verification Rule Format language in the attached computer program listing appendix.

In step 214, the design corrections are implemented in the integrated circuit design database by the design correction tool.

In step 216, the integrated circuit design proceeds to the manufacturing process.

Step 218 is the exit point of the flow chart 200.

FIG. 3 illustrates an example of an automated design correction tool for the method of FIG. 2.

Step 302 is the entry point of the flow chart 300.

In step 304, the results database generated by the physical design validation tool is translated into an error cell by an automated tool that is specific to the place and route system used in the integrated circuit design. The error cell is a database representation in a standard format of the error objects detected in the integrated circuit design. An example of a standard error format that may be used to create error cells by automated tools is the error cell representation in the Milkyway™ database from Synopsys™.

In step 306, a type of design error that requires correction is retrieved from the error cell. Examples of design error types include but are not limited to design violations resulting from missing redundant vias, metal spacing violations, antenna violations, well-spacing violations, metal geometry violations such as minimum area for a specific metal layer, and so on. This is only a small representation of a list that encompasses all design violations of specific process rules that are checked and that should be adhered to for the integrated circuit to work in the desired manner upon manufacture.

In step 308, a location of the error type where a via is to be inserted is retrieved from the error cell.

In step 310, objects in the design database of the integrated circuit design that abut one another at the location of the error type are identified to ensure that an existing via at the error type location is instantiated at the top level of the design hierarchy and to identify the net in which an additional via is to be inserted.

In step 312, if abutting objects at the error type location belong to different nets, then the flow chart continues from step 314. If the abutting objects at the error type location belong to the same net, then the flow chart continues from step 316.

In step 314, a warning is issued to indicate that further information is required to correct the design error, and the flow chart continues from step 318.

In step 316, an additional via object is inserted in the integrated circuit design database in accordance with the design rules of the physical design validation tool to avoid introducing a new design error.

In step 318, if there are any more locations of the current error type to be corrected, then the flow chart continues from step 308. Otherwise, the flow chart continues from step 320.

In step 320, if there are any more components of the current error type to be corrected, then the flow chart continues from step 306. Otherwise, the flow chart continues from step 322.

Step 322 is the exit point of the flow chart 300.

The same method illustrated by the flow chart of FIG. 3 may also be applied to other aspects of the design flow, including well-fill, notch-gap, metal holes, and so on. Well-fill is the process of striping N-wells and P-wells for all the standard cells in the integrated circuit design. The wells are typically striped according to standard techniques as the wells typically abut one another and are connected to the same voltage. In case there is a non-standard cell that abuts the standard cells, then the striping is avoided for that region of the design, however, care should be taken to ensure that the spacing, electrical connectivity, and other geometric rules guiding the well placement are adhered to.

Notch-gap avoidance fills in notches in the design that are created by the router. Based on the accessibility to pins and connectivity interfaces across design hierarchies, there are simulations in the design flow in which the router inadvertently creates a notch, which is a design rule violation. The notch is filled in to avoid manufacturability and process based design errors.

The steps described above with regard to the flow chart described above may also be implemented by instructions performed on a computer. The instructions may be embodied in a medium such as a disk, CD-ROM, or other computer readable media according to well known computer programming techniques.

In another aspect of the present invention, a computer program product for automatically correcting errors in an integrated circuit design includes:

a medium for embodying a computer program for input to a computer; and a computer program embodied in the medium for causing the computer to perform steps of:

(a) performing a physical design validation of an integrated circuit design to verify compliance with a set of design rules;

(b) generating a results database of design rule violations detected by the physical design validation;

(c) identifying locations in the integrated circuit design from the results database for making design corrections according to a post-processing rule deck so that the locations of the design corrections comply with the set of design rules; and (d) implementing the design corrections in the integrated circuit design.

FIG. 4 illustrates a flow chart 400 of a computer program product for automatically correcting a single design error in an integrated circuit.

Step 402 is the entry point of the flow chart 400.

In step 404, the results database generated by a physical design validation tool is received as input.

In step 406, the results database is translated into an error cell.

In step 408, an error type is selected from the error cell.

In step 410, a location of the error type is retrieved from the error cell.

In step 412, objects in the design database of the integrated circuit design that abut one another at the location of the error type are checked to determine whether they belong to the same net.

In step 414, if the objects that abut one another at the location of the error type belong to the same net, then the flow chart continues from step 416. If the objects that abut one another at the location of the error type do not belong to the same net, then the flow chart continues from step 418.

In step 416, an additional via is inserted at the location of the error type in the design database according to the design rules of the physical design validation tool to avoid introducing a new design error, and the flow chart continues from step 418.

In step 418, a warning is issued to indicate that further information is required to correct the design error.

Step 420 is the exit point of the flow chart 400.

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described my means of specific embodiments and applications thereof, numerous modifications and variations could be made thereto by those skilled in the art without departing from the scope of the invention set forth in the following claims.

What is claimed is:

1. A method comprising steps of:
   (a) performing a physical design validation of an integrated circuit design for an integrated circuit die to verify compliance with a set of design rules to ensure that substantially all spatial constraints are satisfied for the traces and devices formed in various layers of the integrated circuit die;
   (b) generating a results database of design rule violations detected by the physical design validation;
   (c) identifying locations in the integrated circuit design from the results database for making design corrections according to a post-processing rule deck so that the locations of the design corrections comply with the set of design rules and so that the design corrections do not result in another design rule violation; and
   (d) implementing the design corrections in the integrated circuit design.

2. The method of claim 1 wherein the design corrections comprise inserting an additional via at a location identified in step (c).

3. A method comprising steps of:
   performing a physical design validation of an integrated circuit design for an integrated circuit die to verify compliance with a set of design rules to ensure that substantially all spatial constraints are satisfied for the traces and devices formed in various layers of the integrated circuit die;
   generating a results database of design rule violations detected by the physical design validation;
   identifying locations in the integrated circuit design from the results database for making design corrections according to a post-processing rule deck so that the locations of the design corrections comply with the set of design rules; and
   implementing the design corrections in the integrated circuit design comprising steps of:
   translating the results database generated by the physical design validation tool into an error cell;
   selecting an error type from the error cell;
   retrieving a location of the error type from the error cell;
   checking objects in a design database of the integrated circuit design that abut one another at the location of the error type are checked to determine whether they belong to the same net; and
   inserting an additional via at the location of the error type in the design database according to the design rules of the physical design validation tool when the objects that abut one another at the location of the error type belong to the same net.

4. The method of claim 3 further comprising a step of issuing a warning when the objects that abut one another at the location of the error type do not belong to the same net.

5. A computer readable storage medium tangibly embodying instructions for a computer that when executed by the computer implement a method for automating place and route corrections for an integrated circuit design from physical design validation, the method comprising steps of:
   (a) performing a physical design validation of an integrated circuit design for an integrated circuit die to verify compliance with a set of design rules to ensure that substantially all spatial constraints are satisfied for the traces and devices formed in various layers of the integrated circuit die;
   (b) generating a results database of design rule violations detected by the physical design validation;
   (c) identifying locations in the integrated circuit design from the results database for making design corrections according to a post-processing rule deck so that the locations of the design corrections comply with the set of design rules and so that the design corrections do not result in another design rule violation; and
   (d) implementing the design corrections in the integrated circuit design.

6. The computer readable storage medium of claim 5 wherein the design corrections comprise inserting an additional via at a location identified in step (c).

7. A computer readable storage medium tangibly embodying instructions for a computer that when executed by the computer implement a method for automating place and route corrections for an integrated circuit design from physical design validation, the method comprising steps of:
   performing a physical design validation of an integrated circuit design for an integrated circuit die to verify compliance with a set of design rules to ensure that substantially all spatial constraints are satisfied for the traces and devices formed in various layers of the integrated circuit die;
   generating a results database of design rule violations detected by the physical design validation;
   identifying locations in the integrated circuit design from the results database for making design corrections according to a post-processing rule deck so that the locations of the design corrections comply with the set of design rules; and
   implementing the design corrections in the integrated circuit design comprising steps of:
   translating the results database generated by the physical design validation tool into an error cell;
   selecting an error type from the error cell;
   retrieving a location of the error type from the error cell;
   checking objects in a design database of the integrated circuit design that abut one another at the location of the error type are checked to determine whether they belong to the same net; and
   inserting an additional via at the location of the error type in the design database according to the design rules of the physical design validation tool when the objects that abut one another at the location of the error type belong to the same net.

8. The computer readable storage medium of claim 7 further comprising a step of issuing a warning when the objects that abut one another at the location of the error type do not belong to the same net.

* * * * *